United States Patent
Lee (10) Patent No.: US 7,245,008 B2
(45) Date of Patent: Jul. 17, 2007

(54) BALL GRID ARRAY PACKAGE, STACKED SEMICONDUCTOR PACKAGE AND METHOD FOR MANUFACTURING THE SAME

(75) Inventor: Kyu-Jin Lee, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/879,066

(22) Filed: Jun. 30, 2004

(65) Prior Publication Data

US 2005/0040529 A1    Feb. 24, 2005

(30) Foreign Application Priority Data

Aug. 20, 2003  (KR) .................. 10-2003-0057514

(51) Int. Cl.
*H01L 23/02* (2006.01)
*H01L 23/48* (2006.01)
*H01L 23/52* (2006.01)
*H01L 21/44* (2006.01)
*H01L 21/48* (2006.01)

(52) U.S. Cl. .............. 257/686; 257/780; 257/784; 257/787; 257/E23.116; 438/109; 438/127; 438/617

(58) Field of Classification Search .......... 257/686, 257/780, 784, 787, 777; 438/109, 112, 124, 438/127, 617
See application file for complete search history.

(56) References Cited

U.S. PATENT DOCUMENTS

| | | | |
|---|---|---|---|
| 4,807,021 A * | 2/1989 | Okumura | 257/777 |
| 5,111,278 A * | 5/1992 | Eichelberger | 257/698 |
| 5,346,861 A * | 9/1994 | Khandros et al. | 438/15 |
| 5,659,203 A * | 8/1997 | Call et al. | 257/778 |
| 5,776,796 A * | 7/1998 | Distefano et al. | 438/106 |
| 5,950,070 A * | 9/1999 | Razon et al. | 438/113 |
| 5,959,363 A * | 9/1999 | Yamada et al. | 257/787 |
| 5,969,417 A * | 10/1999 | Yamashita et al. | 257/693 |
| 6,291,884 B1* | 9/2001 | Glenn et al. | 257/747 |
| 6,344,401 B1* | 2/2002 | Lam | 438/460 |
| 6,552,426 B2* | 4/2003 | Ishio et al. | 257/692 |
| 6,815,254 B2* | 11/2004 | Mistry et al. | 438/108 |
| 2002/0101056 A1* | 8/2002 | Fandrich et al. | 280/491.5 |
| 2005/0001329 A1* | 1/2005 | Matsuki et al. | 257/777 |

FOREIGN PATENT DOCUMENTS

| | | |
|---|---|---|
| JP | 05-082582 | 4/1993 |
| JP | 07-161764 | 6/1995 |
| KR | 2002-0073838 | 9/2002 |

OTHER PUBLICATIONS

Korean Office Action issued Sep. 30, 2005 (Korean and English translation).

* cited by examiner

*Primary Examiner*—Nitin Parekh
(74) *Attorney, Agent, or Firm*—Harness, Dickey & Pierce, P.L.C.

(57) ABSTRACT

A BGA package including a substrate, a plurality of solder balls on the semiconductor and an encapsulant, which leaves the solder balls partially exposed on the semiconductor chip, thereby reducing the size of the BGA package. In addition, an edge of the substrate may extend beyond an edge of the semiconductor chip. Stacked BGA packages and methods of manufacturing a BGA (or stacked BGA) package are also disclosed.

20 Claims, 10 Drawing Sheets

BALL GRID ARRAY PACKAGE, STACKED SEMICONDUCTOR PACKAGE AND METHOD FOR MANUFACTURING THE SAME

PRIORITY STATEMENT

This application claims priority from Korean Patent Application No. 2003-57514, filed Aug. 20, 2003, the contents of which are hereby incorporated herein by reference in their entirety.

BACKGROUND OF THE INVENTION

1. Field of the Invention

The present invention relates generally to semiconductor packages and methods for manufacturing the same. More particularly, the present invention relates to ball grid array (BGA) packages, stacked BGA packages having a plurality of BGA packages, and methods for manufacturing the same.

2. Description of the Related Art

In general, semiconductor wafers are subjected to deposition, etching, planarization and/or lithographic processes. The wafer may then be diced using scribe lines to form multiple semiconductor chips. The semiconductor chips may be mounted onto printed circuit boards (PCBs) or other mounting substrates, utilizing various packaging methods.

As a result of developments in electrical products, semiconductor packages are becoming more highly integrated to reduce the size and/or thickness. In order to increase the number of semiconductor chips on a limited mounting area, chip scale packages (CSPs) have been generally adopted in semiconductor packages. The mounting area of CSPs may be smaller than other packages, because the extent of a CSP, i.e., the area being multiplied width by length, compared to the semiconductor chip may be less than the ratio of 1:1.2. Types of CSPs, such as ball grid array (BGA) packages, including semiconductor device packages, are known.

Figure 1:
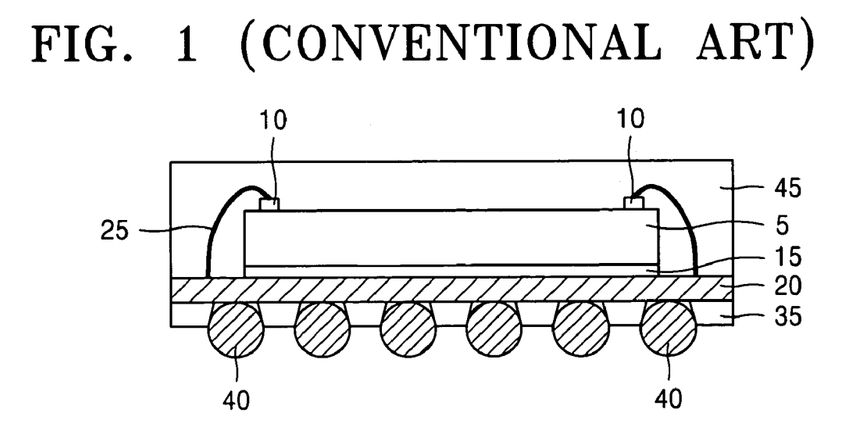
FIG. 1 is a cross-sectional view of a conventional WBGA package.

FIG. 1 is a cross-sectional view of a conventional wire bonding BGA (WBGA) package. Referring to FIG. 1, a semiconductor chip 5 with a plurality of bonding pads 10 may be attached on the top of a substrate 20 by an adhesive layer 15. The plurality of bonding pads 10 and the substrate 20 including a plurality of metal landing pads (not shown) may be connected by a series of bonding wires 25. An encapsulant 45 may be utilized to cover the semiconductor chip 5 and the series of bonding wires 25. A solder mask 35 may be formed on the substrate 20 and a plurality of solder balls 40 may be placed on the corresponding solder ball pads (not shown) on an opposite side of the semiconductor chip 5. The plurality of solder balls 40 may be attached after the encapsulant 45 is added.

In order to mount a plurality of semiconductor chips in a limited area, stacking technology for manufacturing multiple semiconductor packages has been adopted. Accordingly, each unit BGA package for the stackable package has a thickness profile. Further, in order to attach solder balls on the top of the semiconductor chip, either additional patterning processes or boards may be needed.

SUMMARY OF THE INVENTION

The exemplary embodiments of the present invention provide a variety of BGA packages, stacked BGA packages, and methods for manufacturing such BGA packages that may reduce the size and/or cost of the BGA package. In exemplary embodiments of the present invention, a BGA package includes solder balls on semiconductor chip. In other exemplary embodiments of the present invention, a loop height of bonding wires is removed from a height determination of the BGA package by the solder balls. In other exemplary embodiments of the present invention, a BGA package includes solder balls only over the semiconductor chip(s). In exemplary embodiments of the present invention, methods for manufacturing BGA packages include forming solder balls on a semiconductor chip before encapsulating the semiconductor chip. In exemplary embodiments of the present invention, stacked BGA packages may include fewer substrates, such as intermediate substrates.

In an exemplary embodiment of the present invention, a BGA package includes a substrate, a semiconductor chip, a plurality of solder balls formed on the semiconductor chip and an encapsulant sealing the semiconductor chip. The plurality of solder balls may be partially exposed on the semiconductor chip outside of the encapsulant.

In another exemplary embodiment, a BGA package includes a semiconductor chip with a plurality of bonding pads and solder ball pads on an active surface, a substrate with a plurality of bonding fingers and substrate lands adhered to the semiconductor chip, a series of bonding wires connected to the corresponding plurality of bonding pads and bonding fingers, a plurality of solder balls connected to the plurality of solder ball pads on the semiconductor chip and an encapsulant sealing the semiconductor chip and the series of bonding wires. The plurality of solder balls may be partially exposed on the semiconductor chip outside of the encapsulant. In another exemplary embodiment, an edge of the substrate may extend beyond an edge of the semiconductor chip.

In an exemplary embodiment, a stacked BGA package includes an upper and lower BGA package. Each unit BGA package may include a semiconductor chip with a plurality of bonding pads and solder ball pads on an active surface, a substrate with a plurality of bonding fingers and substrate lands adhered to the semiconductor chip, a series of bonding wires connected to the corresponding plurality of bonding pads and bonding fingers, a plurality of solder balls connected to the plurality of solder ball pads on the semiconductor chip and an encapsulant sealing the semiconductor chip and the series of bonding wires.

An exemplary embodiment of the present invention is directed to a method of manufacturing a BGA package including providing a substrate, mounting a semiconductor chip on the substrate, forming a plurality of solder balls on the semiconductor chip and encapsulating the semiconductor chip, wherein the plurality of solder balls are partially exposed on the semiconductor chip.

In another exemplary embodiment, a method of manufacturing a BGA package includes providing a semiconductor chip with a plurality of bonding pads and solder ball pads on an active surface, attaching a substrate with a plurality of bonding fingers and substrate lands to the semiconductor chip, attaching a series of bonding wires to the corresponding plurality of bonding pads and bonding fingers, forming a plurality of solder balls on the plurality of solder ball pads of the semiconductor chip and encapsulating the semiconductor chip and the series of bonding wires, wherein the plurality of solder balls are partially exposed on the semiconductor chip.

BRIEF DESCRIPTION OF THE DRAWINGS

The present invention will become more readily apparent by describing in detail exemplary embodiments of the present invention thereof with reference to the attached drawings, in which.

It should be noted that these Figures are intended to illustrate the general characteristics of methods and devices of exemplary embodiments of this invention, for the purpose of the description of such exemplary embodiments herein. These drawings are not, however, to scale and may not precisely reflect the characteristics of any given embodiment, and should not be interpreted as defining or limiting the range of values or properties of exemplary embodiments within the scope of this invention.

In particular, the relative thicknesses and positioning of layers or regions may be reduced or exaggerated for clarity. Further, a layer is considered as being formed "on" another layer or a substrate when formed either directly on the referenced layer or the substrate or formed on other layers or patterns overlaying the referenced layer.

DETAILED DESCRIPTION OF EXEMPLARY EMBODIMENTS

The present invention will be described more fully with reference to the accompanying drawings, in which exemplary embodiments of the invention are shown. It should be understood, however, that exemplary embodiments of the present invention described herein can be modified in form and detail without departing from the spirit and scope of the invention. Accordingly, the exemplary embodiments described herein are provided by way of example and not of limitation, and the scope of the present invention is not restricted to the particular embodiments described herein.

Figure 2:
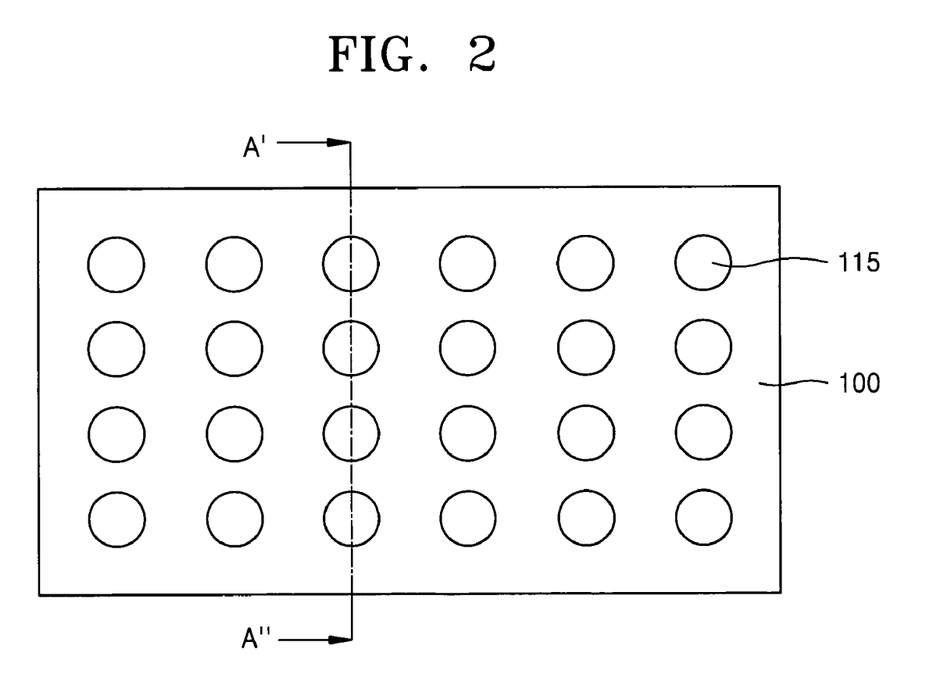
FIGS. 2 and 3 are plan views to describe a BGA package and method for manufacturing according to an exemplary embodiment of the present invention.

Referring to FIG. 2, according to an exemplary embodiment of the present invention, a semiconductor chip 100 including a plurality of solder ball pads 115 for placing solder balls (not shown) may be provided. The solder ball pads 115 may be made of copper (Cu), aluminum (Al) or alloys thereof, and may serve as an input/output terminal. Specifically, a metal layer which may be used to form the solder ball pads 115 may be deposited on the surface of semiconductor chip 100 to make contact with both a bonding pad and a corresponding connective trace (not shown) and then patterned using a conventional technique.

In addition, a barrier metal layer including gold (Au), nickel (Ni), titanium (Ti) or alloys thereof may be formed on the solder ball pads 115 to increase the adhesion strength between the solder ball pads 115 and a solder ball to be placed on the solder ball pad 115. The barrier metal layer may be formed by sputtering, evaporation or electroplating technique. Other metal layers also may be a part of the solder ball pads 115.

Figure 3:
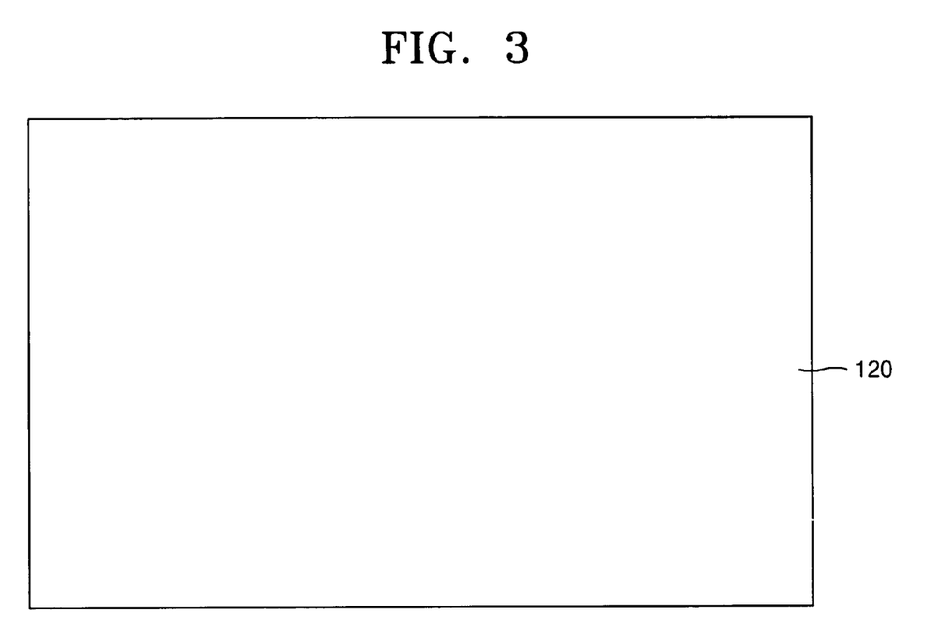
Figure 4:
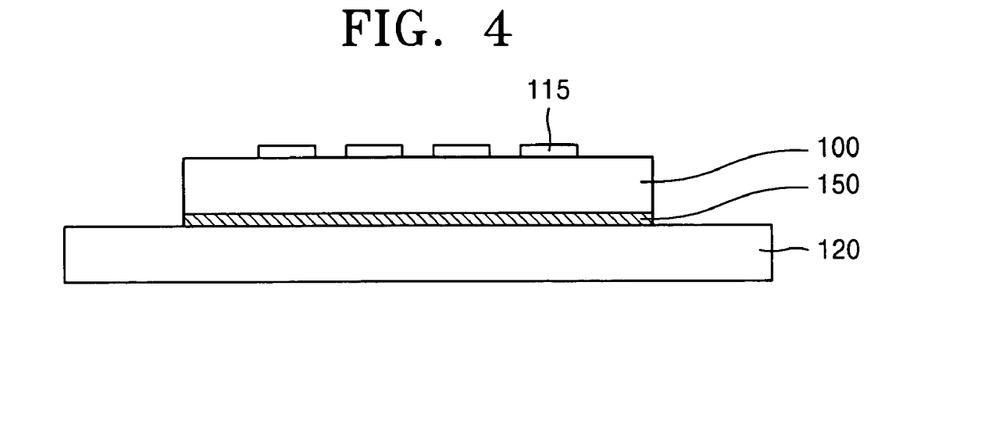
FIGS. 4 through 6 are cross-sectional views of a BGA package according to an exemplary embodiment of the present invention as illustrated in FIG. 2 taken generally along line A'-A"

With reference to FIGS. 3 and 4, the semiconductor chip 100 with the plurality of solder ball pads 115 may be mounted on the substrate 120. The semiconductor chip 100 and the substrate 120 may be attached by an adhesive layer 150, for example, a paste type epoxy or a preformed film type thermoplastic material. The semiconductor chip 100 need not be electrically connected to the substrate 120; the substrate 120 may provide mounting support for the semiconductor chip 100.

In an exemplary embodiment of the present invention, the semiconductor chip 100 may be electrically connected to the substrate 120 via a conductive adhesive layer 150. Alternatively, flip chip methods including solder ball, stud bump, conductive material and/or a series of metallurgical connections may also be used instead of, or in addition to, the conductive adhesive layer 150.

The length and width of the substrate 120 may be at least same or larger than the length and width of the semiconductor chip 100. Therefore, an edge of the substrate 120 may extend beyond an edge of the semiconductor chip 100.

Figure 5:
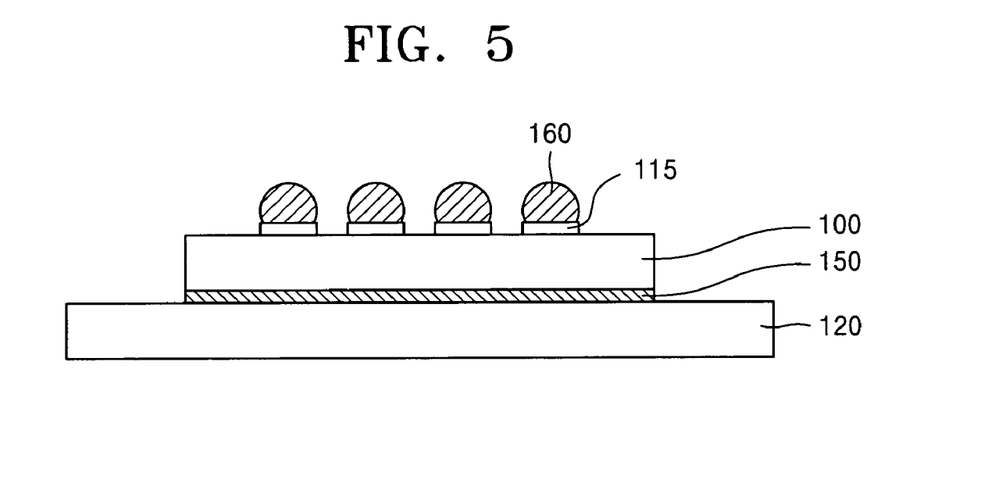

With reference to FIG. 5, a plurality of solder balls 160 may be placed on the solder ball pads 100. The plurality of solder balls 160 may be thermally attached using a solder ball attaching apparatus and undergo a solder-reflow process. The diameter of the solder ball 160 may be approximately 300 um. However, the diameter of the solder ball 160 may vary after the solder-reflow process.

Figure 6:
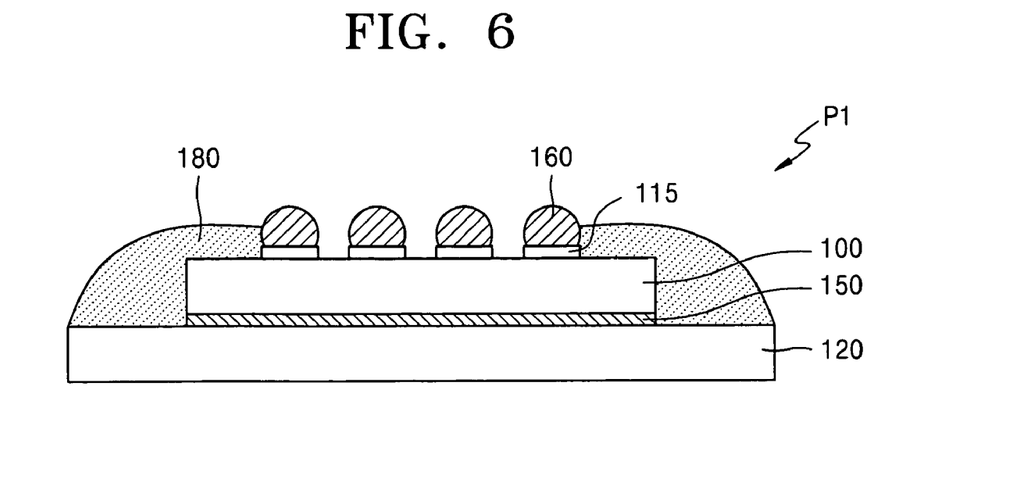

Referring to FIG. 6, an encapsulant 180 may be applied at a level lower than a top of the solder balls 160, leaving the solder balls 160 partially exposed. The encapsulant 180 may be a liquid encapsulation or other suitable polymeric composition and may protect the semiconductor chip 100 from adverse effects of the external environment. A liquid encapsulant 180 may have a property that it is in liquid phase at room temperature and may be generally provided by using a dispenser. As shown in FIG. 6, the encapsulant 180 may cover only a peripheral portion of the semiconductor chip 100. The liquid encapsulant 180 may be cured, and the BGA package (P1) may then be formed. A height of the encapsulant 180 may be determined depending on a height of the solder balls 160.

Figure 7:
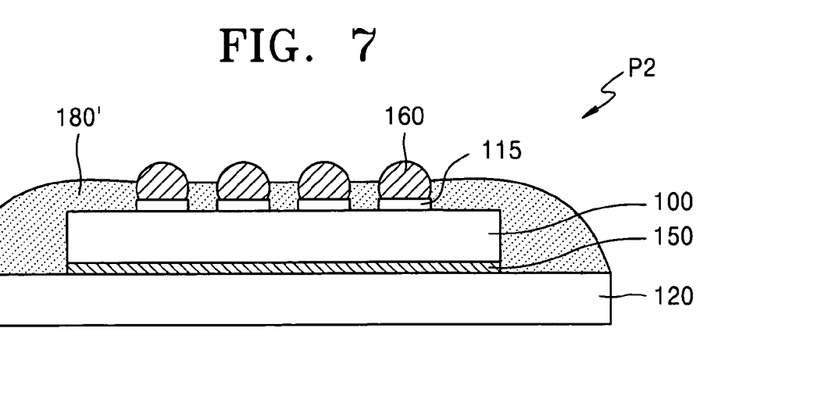
FIG. 7 is a cross-sectional view of a BGA package according to an exemplary embodiment of the present invention.

With reference to FIG. 7, a BGA package (P2) may include an encapsulant 180' in which the encapsulant 180' is fully formed on a top and a peripheral portion of the semiconductor chip 100, leaving the solder balls 160 partially exposed. A height of the encapsulant 180' may be determined depending on a height of the solder balls 160. A solder bump or other conductive bump may be also used to electrically connect the semiconductor chip 100 and the substrate 120. Further, the liquid encapsulant 180, 180' may be filled between the semiconductor chip 100 and the substrate 120 to protect the connected portion from the external environment, thereby forming a fillet surrounding the substrate 120 and improving the reliability of the interconnection.

As described above, according to an exemplary embodiment of the present invention, the solder balls 160 may be attached before an encapsulating process to be formed the encapsulant 180, 180', thereby reducing a patterning process and an additional substrate relative to attaching the solder balls 160 after encapsulating process.

With reference to FIGS. 6 and 7, according to an exemplary embodiment of the present invention, the BGA package (P1, P2) may include the substrate 120, the semiconductor chip 100 mounted on the substrate 120, the plurality of solder balls 160 formed on the semiconductor chip 100 and the encapsulant 180, 180' sealing the semiconductor chip 100 with the plurality of solder balls 160 being exposed.

In exemplary embodiments, the BGA package (P1, P2) with the solder balls 160 placed on the semiconductor chip 100 may not need an additional, intermediate substrates, thereby reducing the thickness of the package.

FIGS. 8 through 14 are views of a method for manufacturing the BGA package (P3) in accordance with another exemplary embodiment of the present invention.

Figure 8:
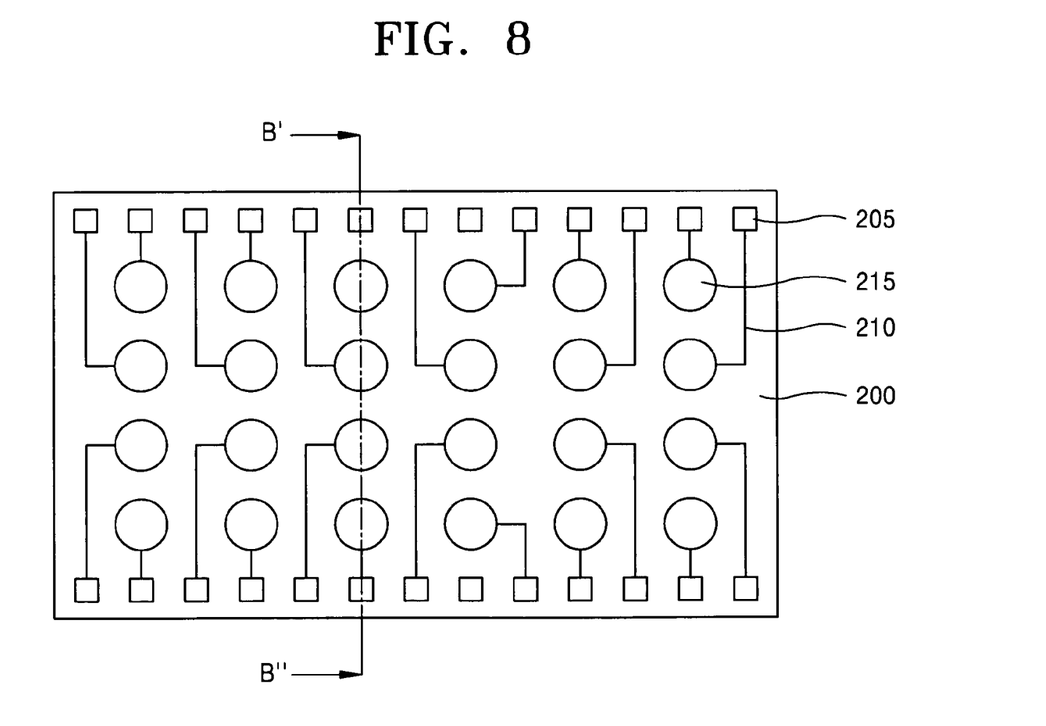
FIGS. 8 and 9 are plan views to describe a BGA package and method for manufacturing according to another exemplary embodiment of the present invention.

With reference to FIG. 8, a semiconductor chip 200 may include a plurality of bonding pads 205 formed on a peripheral area of an active surface and a plurality of solder ball pads 215 connected to a series of rerouting conductive patterns 210 formed on a center area of the active surface. The bonding pads 205 may be formed on the semiconductor chip 200 using conventional techniques, typically including aluminum or copper.

In general, a passivation layer (not shown) may include a silicon nitride film, a silicon oxide film or a polyimide and may be formed to protect the top of semiconductor chip 200 but expose the bonding pads 205. The rerouting conductive patterns 210 and the solder ball pads 215 may be patterned after forming a conductive layer, such as copper (Cu), aluminum (Al) or titanium (Ti) or alloys thereof. A barrier metal, such as gold (Au), nickel (Ni) or titanium (Ti) or alloys thereof may be formed on the solder ball pads 215 to increase the adhesion strength between the solder ball pads 215 and solder balls to be placed on the solder ball pad 215. Other metal layers may also be a part of the solder ball pads 215.

The series of rerouting conductive patterns 210 may be formed on the peripheral portion of semiconductor chip 200, and may be connected to a corresponding bonding pad 205 electrically connected to the solder balls as external terminals. For example, each rerouting conductive pattern 210 may be connected to a corresponding bonding pad 205 such as address electrode, ground electrode, data electrode, power supply voltage (Vcc), etc. for supplying various signals, for example, signal write, signal read or signal select signal control.

Figure 9:
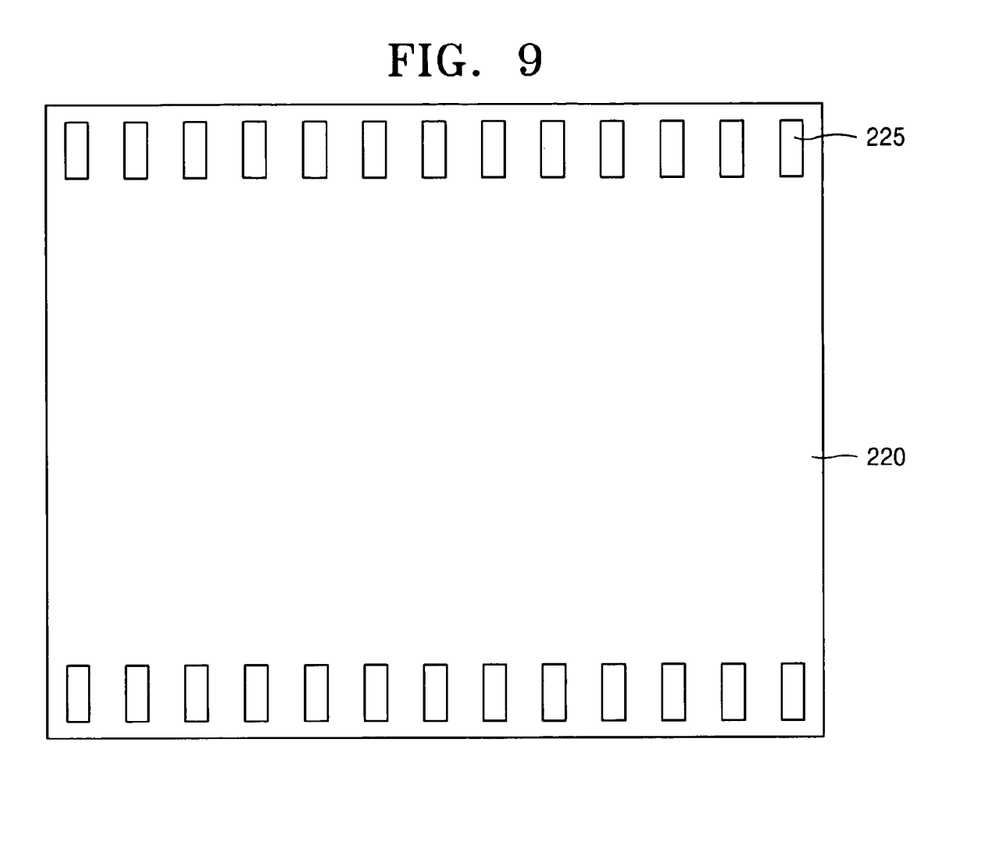
Figure 10:
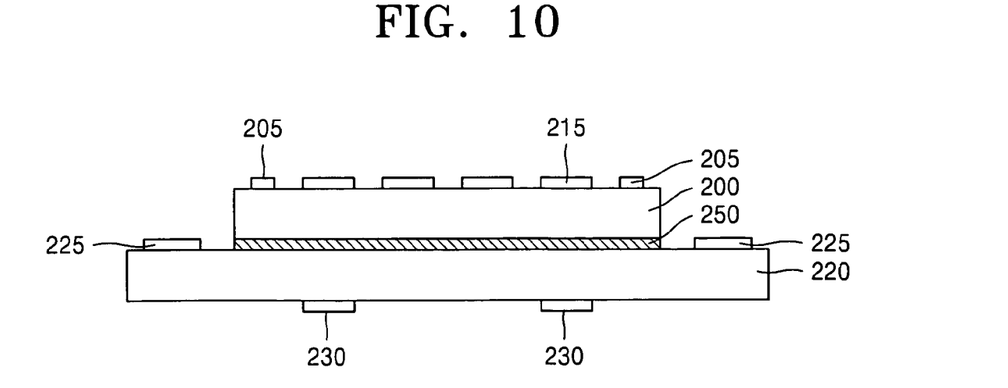
FIGS. 10 and 11 are cross-sectional views of a BGA package according to another exemplary embodiment of the present invention as illustrated in FIG. 8 taken generally along line B'-B"

The semiconductor chip 200 may be provided on a substrate 220 as shown in FIGS. 9 and 10. A plurality of bonding fingers 225 may be formed on a top of the substrate 220. The bonding fingers 225 may be patterned after forming a conductive layer, such as copper (Cu) and/or nickel (Ni) or alloys thereof. Silver (Ag), nickel (Ni) or alloys thereof may be formed on the bonding fingers 225 to increase the bonding strength of bonding wires. A plurality of substrate lands 230 may be formed on a bottom of the substrate 220. In addition, an edge of the substrate 220 may extend beyond an edge of a corresponding semiconductor chip 200, therefore, the bonding fingers 225 may be located on an outside of the semiconductor chip 200. The semiconductor chip 200 and the substrate 220 may be attached by an adhesive layer 250, for example, a paste type epoxy or preformed film type thermoplastic material.

Figure 11:
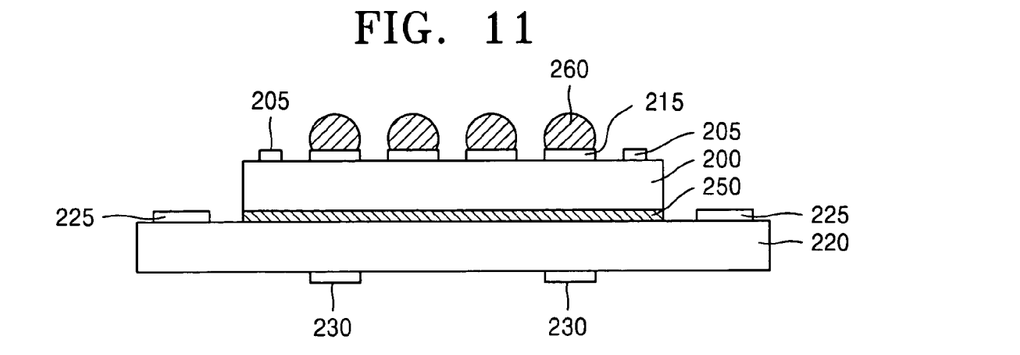
Figure 12:
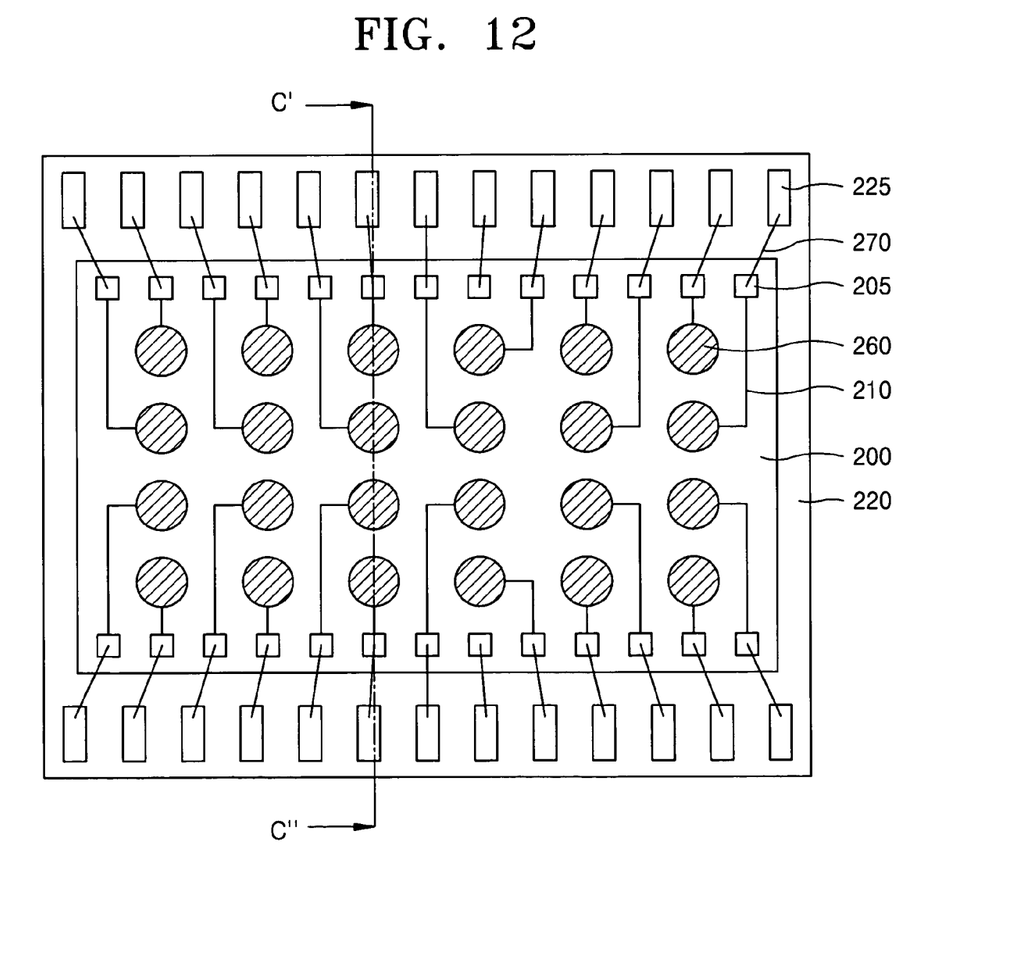
Figure 13:
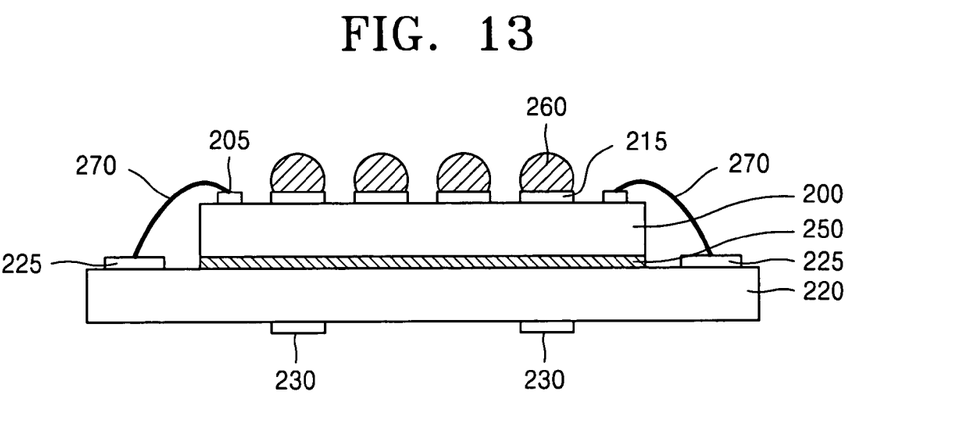
FIGS. 13 and 14 are cross-sectional views of a BGA package according to another exemplary embodiment of the present invention as illustrated in FIG. 12 taken generally along line C'-C"

Referring to FIG. 11, a solder ball 260 may be placed and then thermally attached on a corresponding solder ball pad 121. A series of bonding wires 270 may be connected to the corresponding bonding pads 205 and bonding fingers 225, as shown in FIGS. 12 and 13. The bonding wires 270 may be a conductive material such as gold (Au) or aluminum (Al).

Figure 14:
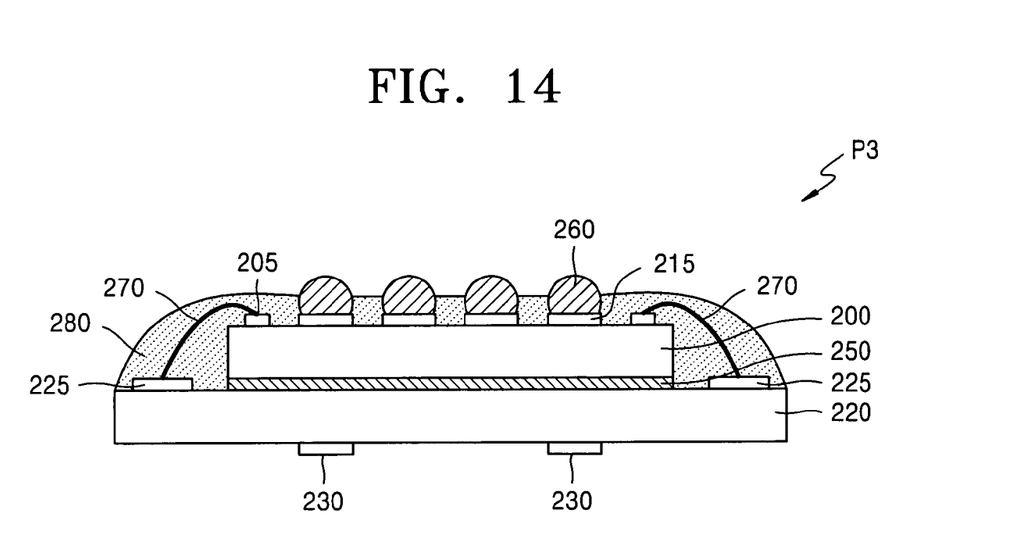

With reference to FIG. 14, the BGA package (P3) may include an encapsulant 280 in which the encapsulant 280 is sealed on a top and peripheral portion of the semiconductor chip 200, leaving the solder balls 260 partially exposed. A height of the encapsulant 280 may be determined depending on a height of the solder balls 260. Further, the encapsulant 280 may seal the semiconductor chip 200 and the bonding wires 270 in order to protect the bonding pads 205 and the bonding wires 270 from contamination, moisture and/or mechanical contact with the external environment. The encapsulant 280 may be a liquid encapsulant or other suitable polymeric composition. The encapsulant 280 may be generally provided by using a dispenser on the semiconductor chip 200 and the bonding wires 270 and may then be cured.

As described above, according to another exemplary embodiment of the present invention, the solder balls 260 may be attached before an encapsulating process is performed, thereby reducing a patterning process and an additional substrate relative to attaching the solder balls 260 after the encapsulating process.

As set forth above, in exemplary embodiments, the BGA package (P3) having solder balls 260 placed on the semiconductor chip 200 may not need an additional, intermediate substrates, as shown in FIG. 14.

The BGA package (P3) may include the semiconductor chip 200 having the plurality of bonding pads 205 formed in a peripheral area of the active layer and the plurality of solder ball pads 215 formed in a center area of the active layer. The semiconductor chip 200 may be attached by an adhesive layer 250 on the top of the substrate 220. The bonding fingers 225 and the substrate lands 230 may be formed on the substrate 220 on an edge of the substrate that extends beyond an edge of the semiconductor chip 200. The bonding wires 270 may be electrically connected to the bonding pads 205 and the bonding fingers 225. The solder balls 260 may be attached on the corresponding solder ball pads 215. The encapsulant 280 may seal the semiconductor chip 200 and the bonding wires 270 and a height of the encapsulant 280 may be determined depending on a height of the solder balls 260.

As a result, the BGA package (P3) may reduce the vertical space needed, thereby reducing the thickness of the package and allowing the package to be stacked by using the substrate lands 230 on the substrate 220.

Figure 15:
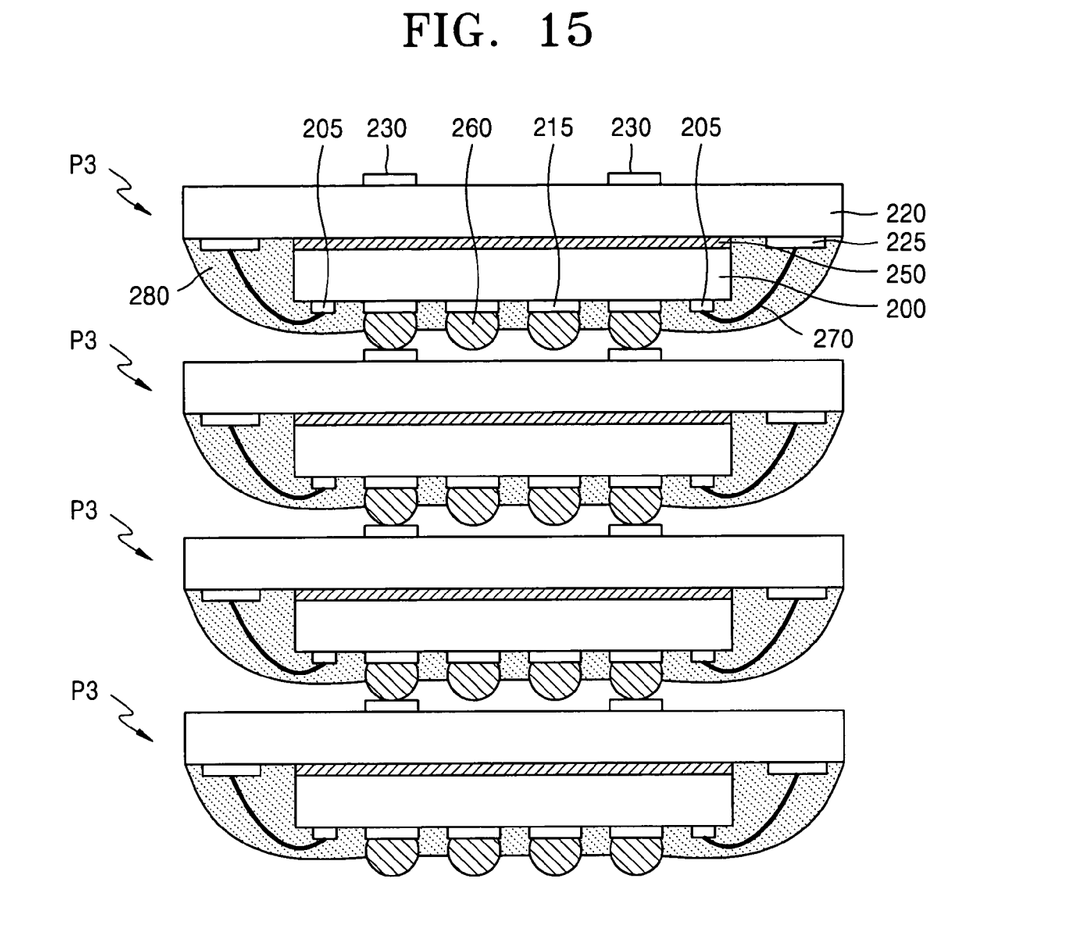
FIGS. 15 through 17 are cross-sectional views of the stacked BGA packages according to exemplary embodiments of the present invention.
Figure 16:
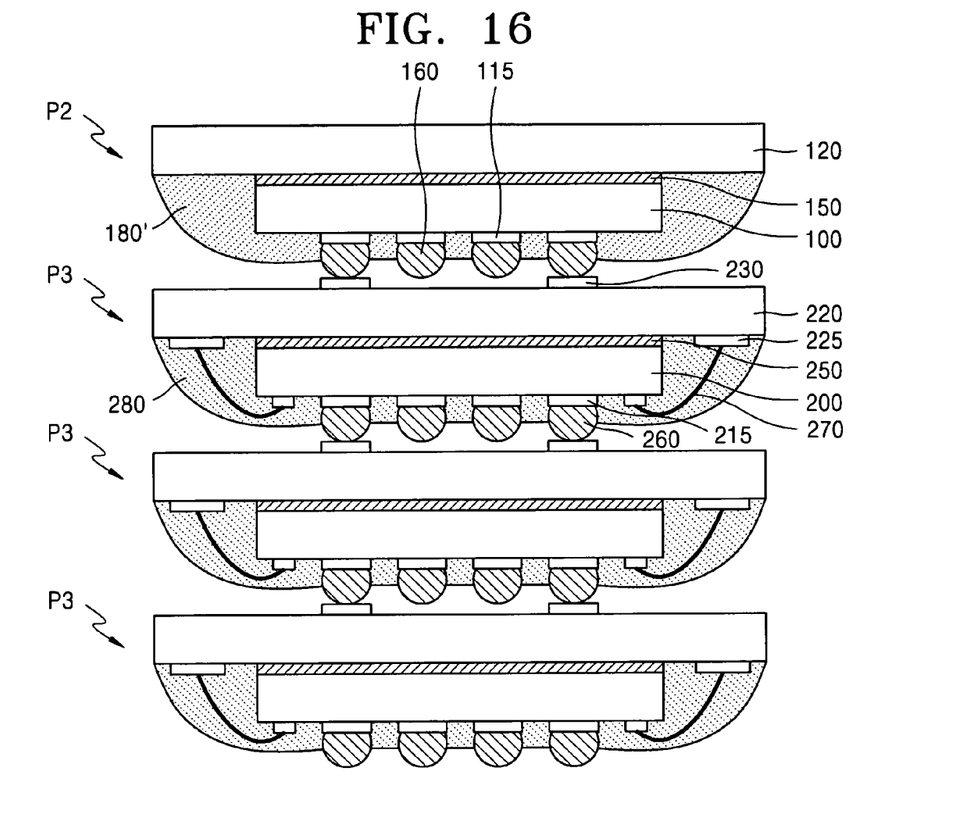
Figure 17:
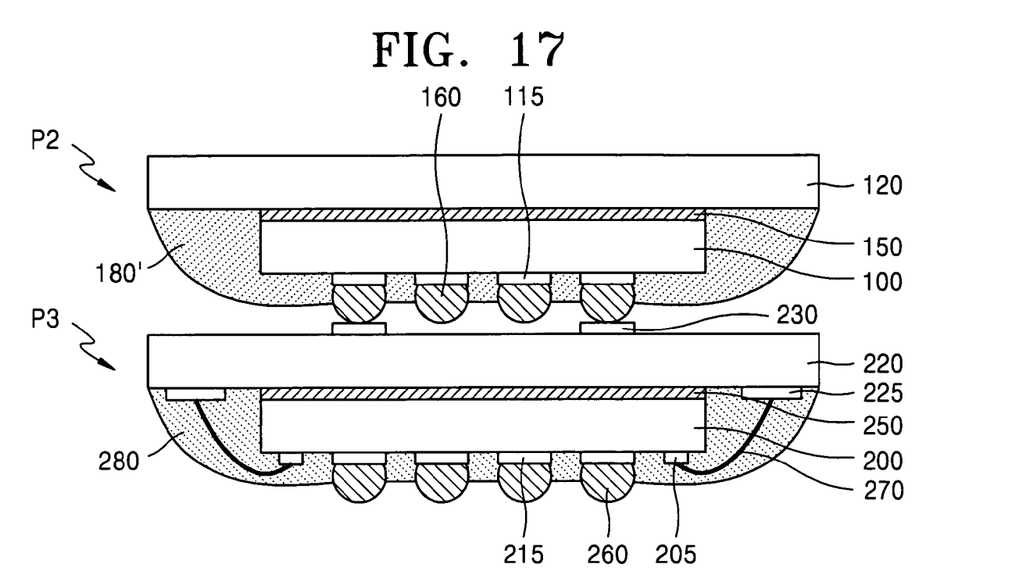

FIGS. 15 through 17 are views of a method for manufacturing stacked BGA packages having the BGA package (P1, P2, P3) in accordance with exemplary embodiments of the present invention.

With reference to FIG. 15, the stacked BGA package may include two or more unit BGA packages (P3). Each BGA package (P3) may be stacked by the solder balls 260 of the upper unit BGA package (P3) and the substrate lands 230 of the lower unit BGA package (P3). The BGA package (P3) may be a CSP, thereby reducing the size of the stacked BGA package and/or vertical space.

With reference to FIG. 16, as described in exemplary embodiments of the present invention, the stacked BGA package may include two or more unit BGA packages (P3) and the BGA package (P2) as an upper package. Each BGA package (P3) may be stacked by the solder balls 260 and the substrate lands 230. The BGA package (P2) having no substrate lands may be placed on the top of the stacked BGA package. The solder balls 160 of the BGA package (P2) may be connected to the substrate lands 230 of an adjacent BGA package (P3).

With reference to FIG. 17, the stacked BGA package may include the BGA package (P3) and the BGA package (P2) having no substrate lands. The solder balls 160 of the BGA package (P2) may be connected to the substrate lands 230 of the lower BGA package (P3).

As mentioned above exemplary embodiments of the present invention, the method for manufacturing the BGA package may be adverse to the conventional method that is attaching the solder balls after encapsulating process. The implementation of this invention may reduce the likelihood of manufacturing process for stacked BGA packages and also reduce the height of the stacked BGA package relative to the other stacked packages. The stacked BGA packages may reduce interconnection paths from each BGA package to external connection terminals and also can reduce the height of the package stack. The method for manufacturing the stacked BGA package of the present invention may be adopted to NAND Flash memory and DRAM products to increase the memory density.

Although the invention has been described with reference to various aspects and exemplary embodiments thereof, it will be apparent to those of ordinary skill in the art that various modifications and adaptations to the described embodiments may be made without departing from the spirit and scope of the invention as defined in the appended claims.

What is claimed is:

1. A stacked BGA package, comprising:
at least two BGA packages stacked together, wherein each BGA package includes:
a substrate;
a semiconductor chip mounted on the substrate;
a plurality of solder balls formed in an array on the semiconductor chip, the semiconductor chip interposed between the substrate and the plurality of solder balls; and
an encapsulant sealing the semiconductor chip and in contact with a peripheral edge of the plurality of solders balls on an outer periphery of the array, the encapsulant not sealing any interior portions of the plurality of solder balls within the outer periphery and are positioned between peripheral rows of a plurality of bonding pads on the semiconductor chip, the bonding pads being wired bonded to the substrate,
wherein the plurality of solder balls are partially exposed on the semiconductor chip.

2. The stacked BGA package of claim 1, wherein the encapsulant seals an active surface of the semiconductor chip and a thickness of the encapsulant is less than a height of the plurality of solder balls.

3. The stacked BGA package of claim 1, wherein an edge of the substrate extends beyond an edge of the semiconductor chip.

4. The stacked BGA package of claim 1, further comprising a series of bonding wires, electrically connected to the semiconductor chip and the substrate, wherein the series of bonding wires are sealed by the encapsulant.

5. A method of manufacturing the stacked BGA package of claim 1, the method comprising:
providing the substrate;
mounting the semiconductor chip on the substrate;
forming the plurality of solder balls on the semiconductor chip; and
encapsulating the semiconductor chip, wherein the plurality of solder balls are partially exposed on the semiconductor chip.

6. A stacked BGA package, comprising:
at least two BGA packages stacked together, wherein each BGA package includes:
a semiconductor chip with a plurality of bonding pads and solder ball pads on an active surface;
a substrate with a plurality of bonding fingers and substrate lands adhered to the semiconductor chip;
a series of bonding wires connected to the corresponding plurality of bonding pads and bonding fingers;
a plurality of solder balls formed in an array connected to the corresponding plurality of solder ball pads on the semiconductor chip, the semiconductor chip interposed between the substrate and the plurality of solder balls; and
an encapsulant sealing the semiconductor chip, the series of bonding wires, and in contact with a peripheral edge of the plurality of solder balls on an outer periphery of the array, the encapsulant not sealing any interior portions of the plurality of solder balls within the outer periphery,
wherein the plurality of solder balls are partially exposed on the semiconductor chip and are positioned between peripheral rows of a plurality of bonding pads on the semiconductor chip, the bonding pads being wire bonded to the substrate.

7. The stacked BGA package of claim 6, wherein the plurality of solder ball pads are connected to a corresponding one of the plurality of bonding pads.

8. The stacked BGA package of claim 6, wherein an edge of the substrate extends beyond an edge of the semiconductor chip.

9. The stacked BGA package of claim 6, further comprising a plurality of metal patterns, connected to a corresponding one of the plurality of bonding pads in a peripheral area of the active surface and a corresponding one of the plurality of solder ball pads in a center area of the active surface.

10. The stacked BGA package of claim 6, wherein the encapsulant seals the active surface of the semiconductor chip and an exposed surface of the encapsulation is below the plurality of solder balls.

11. A method of manufacturing the stacked BGA package of claim 6, the method comprising:
providing the substrate;
mounting the semiconductor chip on the substrate;
forming the plurality of solder balls on the semiconductor chip; and
encapsulating the semiconductor chip, wherein the plurality of solder balls are partially exposed on the semiconductor chip.

12. A stacked BGA package comprising:
at least two BGA packages stacked together, wherein each BGA package includes:
a semiconductor chip with peripheral rows of a plurality of bonding pads, and solder balls formed in an array and solder ball pads on an active surface, the semiconductor chip interposed between the substrate and the plurality of solder balls;

a substrate with a plurality of bonding fingers and substrate lands adhered to the semiconductor chip;

a series of bonding wires connected to the corresponding plurality of bonding pads and bonding fingers; and an encapsulant sealing the semiconductor chip, the series of bonding wires, and in contact with a peripheral edge of the plurality of solder balls on an outer periphery of the array, the encapsulant not sealing any interior portions of the plurality of solder balls within the outer periphery, wherein the plurality of solder balls are partially exposed on the semiconductor chip and are positioned between the peripheral rows of the plurality of bonding pads on the semiconductor chip, the bonding pads being wire bonded to the substrate; and the at least two BGA packages are stacked using the plurality of solder balls and substrates lands.

13. The stacked BGA package of claim 12, wherein the plurality of solder ball pads are connected to a corresponding one of the plurality of bonding pads.

14. The stacked BGA package of claim 12, wherein an edge of the substrate extends beyond an edge of the semiconductor chip.

15. A method of manufacturing a BGA package, comprising:

providing a substrate;

mounting a semiconductor chip on the substrate;

forming a plurality of solder balls formed in an array on the semiconductor chip; and the semiconductor chip interposed between the substrate and the plurality of solder balls, and an encapsulant sealing the semiconductor chip and in contact with a peripheral edge of the plurality of solders balls on an outer periphery of the array, the encapsulant not sealing any interior portions of the plurality of the solder balls within the outer periphery, wherein the plurality of solder balls are partially exposed on the semiconductor chip and are positioned between peripheral rows of a plurality of bonding pads on the semiconductor chip, the bonding pads being wire bonded to the substrate.

16. The method of claim 15, wherein encapsulating the semiconductor chip further includes:

attaching a series of bonding wires to the semiconductor chip and the substrate; and encapsulating the semiconductor chip and the plurality of bonding wires.

17. The method of claim 15, wherein the encapsulant seals an active surface of the semiconductor chip and a thickness of the encapsulation is less than a height of the plurality of solder balls.

18. A method of manufacturing a BGA package, comprising:

providing a semiconductor chip with peripheral rows of a plurality of bonding pads and solder ball pads on an active surface;

attaching a substrate with a plurality of bonding fingers and substrate lands to the semiconductor chip;

attaching a series of bonding wires to the corresponding plurality of bonding pads and bonding fingers;

forming a plurality of solder balls formed in an array on the plurality of solder ball pads of the semiconductor chip;

the semiconductor chip interposed between the substrate and the plurality of solder balls, and an encapsulant sealing the semiconductor chip and in contact with a peripheral edge of the plurality of solders balls on an outer periphery of the array, the encapsulant sealing the series of the bonding wires and not sealing any interior portions of the plurality of the solder balls within the outer periphery, wherein the plurality of solder balls are partially exposed on the semiconductor chip.

19. The method of claim 18, wherein an edge of the substrate extends beyond an edge of the semiconductor chip.

20. The method of claim 18, wherein the encapsulant seals the active surface of the semiconductor chip and a thickness of the encapsulation is less than a height of the plurality of solder balls.

* * * * *